(12) United States Patent
Song et al.

(10) Patent No.: US 10,205,121 B2
(45) Date of Patent: Feb. 12, 2019

(54) ORGANIC ELECTROLUMINESCENT DISPLAY PANEL AND DISPLAY APPARATUS

(71) Applicant: BOE Technology Group Co., Ltd., Beijing (CN)

(72) Inventors: Young Suk Song, Beijing (CN); Seong Yeol Yoo, Beijing (CN); Seung Jin Choi, Beijing (CN); Hee Cheol Kim, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 45 days.

(21) Appl. No.: 14/436,003

(22) PCT Filed: Oct. 22, 2014

(86) PCT No.: PCT/CN2014/089161
§ 371 (c)(1),
(2) Date: Apr. 15, 2015

(87) PCT Pub. No.: WO2015/180381
PCT Pub. Date: Dec. 3, 2015

(65) Prior Publication Data
US 2015/0349291 A1    Dec. 3, 2015

(30) Foreign Application Priority Data

May 30, 2014  (CN) .......................... 2014 1 0240373

(51) Int. Cl.
  *H01L 51/52*  (2006.01)
  *H01L 27/32*  (2006.01)
(52) U.S. Cl.
  CPC ........ *H01L 51/5253* (2013.01); *H01L 27/322* (2013.01); *H01L 27/3211* (2013.01);
(Continued)

(58) Field of Classification Search
  CPC ..................... H01L 51/5212; H01L 51/5228
  See application file for complete search history.

(56) References Cited

U.S. PATENT DOCUMENTS 6,744,217 B2   6/2004  Park
7,696,688 B2   4/2010  Kim
(Continued)

FOREIGN PATENT DOCUMENTS

CN    1645979 A   7/2005
CN    1812119 A   8/2006
(Continued)

OTHER PUBLICATIONS

International Search Report and Written Opinion for PCT Application No. PCT/CN2014/089161, dated Jan. 8, 2015, 9 pages.
(Continued)

*Primary Examiner* — Yu-Hsi D Sun
(74) *Attorney, Agent, or Firm* — Westman, Champlin & Koehler, P.A.

(57) ABSTRACT

The present invention discloses an organic electroluminescent display panel, comprising: a base substrate; a top-emitting type organic electroluminescent structure located on the base substrate, the organic electroluminescent structure comprising an anode, a light emitting layer and a cathode arranged in this order from the base substrate; and a packaging film covering the organic electroluminescent structure; the organic electroluminescent display panel further comprises a secondary electrode provided on the packaging film and electrically connected with the cathode through a via hole penetrating through the packaging film. Since the secondary electrode is additionally provided on the packaging film and is electrically connected with the cathode through the via hole penetrating through the packaging film, the secondary electrode electrically connected with the cathode can increase an equivalent thickness of the cathode (Continued)

and thus reduce the resistance of the cathode, which can avoid the problem of large voltage drop due to large resistance of the cathode when a thinner metal is used as the cathode, thereby can avoid damage of the organic electroluminescent display panel due to the larger voltage drop.

19 Claims, 5 Drawing Sheets

(52) U.S. Cl.
CPC ...... *H01L 27/3246* (2013.01); *H01L 27/3279* (2013.01); *H01L 51/5221* (2013.01)

(56) References Cited

U.S. PATENT DOCUMENTS

| | | | |
|---|---|---|---|
| 9,142,802 B2* | 9/2015 | Miyamoto | H01L 27/322 |
| 9,425,241 B2 | 8/2016 | Yamakita et al. | |
| 2002/0190256 A1 | 12/2002 | Murakami et al. | |
| 2014/0138631 A1* | 5/2014 | Chung | H01L 51/5228 257/40 |
| 2016/0043343 A1 | 2/2016 | Zhang | |

FOREIGN PATENT DOCUMENTS

| | | |
|---|---|---|
| CN | 202930382 U | 5/2013 |
| CN | 103311265 A | 9/2013 |
| CN | 103325812 A | 9/2013 |
| CN | 103531717 A | 1/2014 |
| CN | 104022139 A | 9/2014 |
| JP | 2002-343579 A | 11/2002 |
| JP | 2006164972 A | 6/2006 |
| KR | 20030058764 A | 7/2003 |

OTHER PUBLICATIONS

Search Report from Chinese Patent Appliction No. 201410240373.6, dated Oct. 30, 2014, 9 pages.

* cited by examiner

ORGANIC ELECTROLUMINESCENT DISPLAY PANEL AND DISPLAY APPARATUS

CROSS-REFERENCE TO RELATED APPLICATION

This application is a Section 371 National Stage application of International Application No. PCT/CN2014/089161, filed Oct. 22, 2014, which has not yet published, which claims priority to Chinese Patent Application No. 201410240373.6, filed May 30, 2014, in Chinese, the contents of which are hereby incorporated by reference in their entirety.

BACKGROUND OF THE INVENTION

Field of the Invention

The present invention relates to the field of display technology, and particularly, to an organic electroluminescent display panel and display apparatus.

Description of the Related Art

An organic electroluminescent display (OLED) device, among existing flat panel display devices, has been widely used in the field of display due to its characteristics such as low power consumption, high color saturation, wide angle of view and the like.

The OLED devices can be classified into a top-emitting type OLED device and a bottom-emitting type OLED device according to a position of a light emitting side thereof. The top-emitting type OLED device, as shown in FIG. 1, generally comprises: a first substrate 101 and a second substrate 102 opposite each other, a thin film transistor 103, an insulating layer 104, an anode 105, a pixel defining layer 106, a light emitting layer 107, a cathode 108 and a packaging film 109 arranged in this order from a side of the first substrate 101 facing the second substrate 102, and a color filter layer 110 arranged on a side of the second substrate 102 facing the first substrate 101. In the top-emitting type OLED device, light emitted from the light emitting layer 107 passes through the cathode 108, the packaging film 109 and the color filter layer 110 in this order and exits from the side of the second substrate 102, that is, from the top of the OLED device.

In the above top-emitting type OLED device, a layer of transparent conductive oxide film, such as indium tin oxide (ITO), may be formed as the cathode by using a magnetron sputtering process so that light emitted from the light emitting layer can transmit through the cathode. The light emitting layer below the cathode, however, will be damaged when manufacturing the cathode by using the magnetron sputtering process, thereby adversely affecting light emitting efficiency of the OLED. Thus, a thin layer of metal is often formed as the cathode by using a vapor deposition process. The formed thin layer of metal has a larger resistance, and especially when being applied in an OLED device of larger size, will generate a larger voltage drop and damage the OLED device.

Thus, a technical problem to be solved in the art is how to avoid the problem of large voltage drop due to the large resistance of the cathode.

SUMMARY OF THE INVENTION

In view of the above, embodiments of the present invention provides an organic electroluminescent display panel and a display apparatus, for solving the problem of large voltage drop due to large resistance of the cathode.

Thus, embodiments of the present invention provide an organic electroluminescent display panel, comprising: a base substrate; a top-emitting type organic electroluminescent structure located on the base substrate, the organic electroluminescent structure comprising an anode, a light emitting layer and a cathode arranged in this order from the base substrate; and a packaging film covering the organic electroluminescent structure; the organic electroluminescent display panel further comprises a secondary electrode provided on the packaging film and electrically connected with the cathode through a via hole penetrating through the packaging film.

In the above organic electroluminescent display panel provided by embodiments of the present invention, because the secondary electrode is additionally provided on the packaging film and is electrically connected with the cathode through the via hole penetrating through the packaging film, the secondary electrode electrically connected with the cathode can increase an equivalent thickness of the cathode and thus reduce the resistance of the cathode, which can avoid the problem of large voltage drop due to the large resistance of the cathode when a thinner metal is used as the cathode, thereby can avoid damage of the organic electroluminescent display panel due to large voltage drop.

In one possible embodiment, the organic electroluminescent display panel provided by the present invention further comprise a packing layer provided on the packaging film, the secondary electrode being provided on the packing layer; wherein the secondary electrode is electrically connected with the cathode through a via hole penetrating through the packing layer and the packaging film.

In one possible embodiment, the organic electroluminescent display panel provided by the present invention further comprise a pixel defining layer located between the base substrate and the cathode and defining respective pixel regions of the display panel; an orthographic projection of the via hole penetrating through the packing layer and the packaging film projected in a direction perpendicular to the base substrate falls within a region where the pixel defining layer is located.

In one possible embodiment, in the organic electroluminescent display panel provided by the present invention, the pixel defining layer is located between the anode and the light emitting layer, or between the cathode and the light emitting layer.

In one possible embodiment, in the organic electroluminescent display panel provided by the present invention, when the light emitting layer is located over the pixel defining layer, a pattern of the light emitting layer has a hollowed-out region at a position corresponding to the via hole penetrating through the packing layer and the packaging film.

In one possible embodiment, in the organic electroluminescent display panel provided by the present invention, a surface of the packing layer contacting the secondary electrode comprises a convex-concave structure consisting of a plurality of convexes and concaves arranged in an array.

In one possible embodiment, in the organic electroluminescent display panel provided by the present invention, the packing layer is a color filter layer including filters of at least three different colors.

In one possible embodiment, in the organic electroluminescent display panel provided by the present invention, a surface of the color filter layer contacting the secondary electrode comprises a convex-concave structure consisting of a plurality of convexes and concaves arranged in an array.

In one possible embodiment, in the organic electroluminescent display panel provided by the present invention, the convex-concave structure consists of a plurality of spherical segments protruding towards the secondary electrode.

In one possible embodiment, in the organic electroluminescent display panel provided by the present invention, the respective spherical segments have the same depth and bottom surfaces of the respective the spherical segments have the same radius.

In one possible embodiment, in the organic electroluminescent display panel provided by the present invention, a ratio of the depth of the spherical segment to the radius of the bottom surface of the spherical segment is 0.026~0.268: 1.

Embodiments of the present invention further provide a display apparatus, comprising the above organic electroluminescent display provided according to the embodiments of the present invention.

DETAILED DESCRIPTION OF PREFERRED EMBODIMENTS OF THE INVENTION

Figure 1:
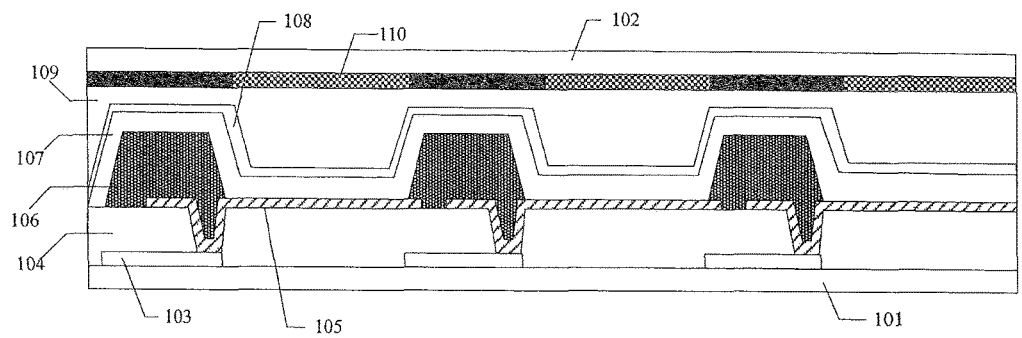
FIG. 1 is a schematic structural diagram showing an existing organic electroluminescent display device.

Specific embodiments of the organic electroluminescent display panel and the display apparatus according to the present invention will be described hereinafter in detail in conjunction with the attached drawings.

Shapes and thicknesses of respective film layers shown in the drawings are not scaled to the real proportion, and positional relationships of the respective film layers may be varied and some film layers may be omitted. Thus, the drawings are intended to only illustrate exemplary embodiments of the present invention, but not to limit the present invention.

Figure 2:
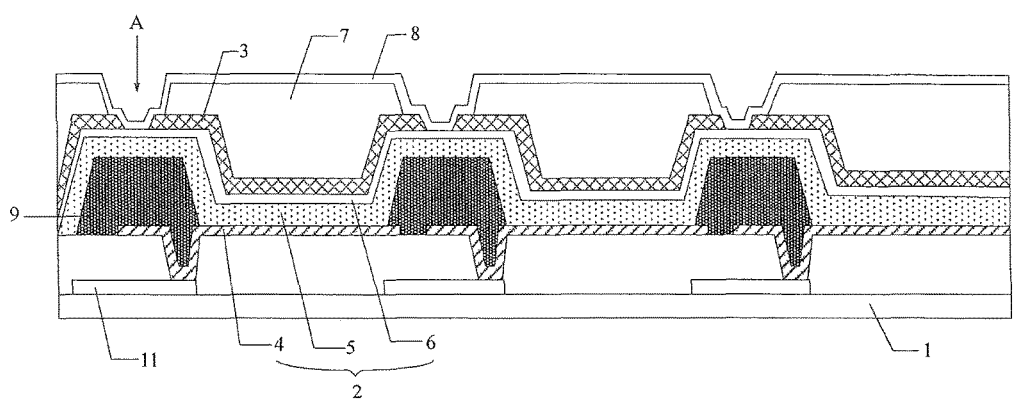
FIG. 2 to FIG. 5 are schematic structural diagrams showing organic electroluminescent display panels provided according to various embodiments of the present invention respectively.

FIG. 2 schematically shows a structure of an organic electroluminescent display panel according to one embodiment of the present invention. As shown in FIG. 2, the organic electroluminescent display panel comprises: a base substrate 1, a top-emitting type organic electroluminescent structure 2 located on the base substrate 1, and a packaging film 3 covering the organic electroluminescent structure 2. The organic electroluminescent structure 2 comprises an anode 4, a light emitting layer 5 and a cathode 6 arranged in this order from the base substrate 1. The organic electroluminescent display panel further comprises a secondary electrode 8 provided on the packaging film. The secondary electrode 8 is electrically connected with the cathode 6 through a via hole A penetrating through the packaging film 3.

In the organic electroluminescent display panel provided by the present invention, because the secondary electrode 8 is additionally provided on the packaging film 3 and is electrically connected with the cathode 6 through the via hole A penetrating through the packaging film 3, the secondary electrode 8 electrically connected with the cathode 6 can increase an equivalent thickness of the cathode 6 and thus reduce the resistance of the cathode 6, which can avoid the problem of larger voltage drop due to the larger resistance of the cathode 6 when a thinner metal is used as the cathode 6, thereby can avoid damage of the organic electroluminescent display panel due to the larger voltage drop.

As shown in FIG. 2, the via hole A through which the secondary electrode 8 is electrically connected with the cathode 6 may be formed by a patterning process on the packaging film 3 by using the packing layer 7. The packing layer 7 has a function similar to that of a photoresist used in existing patterning process. Specifically, after performing exposure and development processes on the packing layer 7, portions of the packaging film 3 which are not covered with the packing layer 7 are etched so that the via hole A is formed in the packaging film 3; then the packing layer 7 on the packaging film 3 may be removed, and the secondary electrode 8 can be manufactured on the packaging film 3.

FIG. 2 shows an embodiment in which the packing layer 7 remains on the packaging film 3 after forming the via hole A in the packaging film 3 using the packing layer 7. As such, not only a peeling-off step can be omitted in the patterning process, but also the remained packing layer 7 can protect the underneath packaging film 3 from being damaged when manufacturing the secondary electrode 8. Materials such as organic resin or the like may be selected for the packing layer 7.

With the configuration of the above embodiment, the packing layer 7, the packaging film 3 and the cathode 6 are arranged between the secondary electrode 8 and the light emitting layer 5, the light emitting layer 5 will not be damaged even if the secondary electrode 8 is manufactured by using transparent conductive oxides, for example, indium tin oxide (ITO) or the like, through a magnetron sputtering process; meanwhile, the ITO film has a good light transmittance, a thicker ITO film can be made to ensure that the secondary electrode 8 has a smaller resistance, and thus to ensure that the cathode 6 electrically connected with the secondary electrode 8 has a smaller resistance, thereby avoiding the problem of larger voltage drop due to the larger resistance of the cathode 6, thereby avoiding damage of the display panel due to the larger voltage drop.

According to one embodiment, in order to avoid light mixing among respective pixel regions of the display panel, the organic electroluminescent display panel may also, as shown in FIG. 2, comprises a pixel defining layer 9 located between the base substrate 1 and the cathode 6 and defining respective pixel regions of the display panel (three pixel regions shown in FIG. 2 are illustrated as an example).

Oxygen or water from external environment may pass through the via hole A penetrating through the packing layer 7 and the packaging film 3 and pollute the light emitting layer 5 in the respective pixel regions, thereby affecting normal display of the display panel. In order to avoid occurrence of such a problem, as shown in FIG. 2, an orthographic projection of the via hole A penetrating through the packing layer 7 and the packaging film 3 projected in a direction perpendicular to the base substrate 1 may be located within a region where the pixel defining layer 9 is located, that is, the via hole A penetrating through the packing layer 7 and the packaging film 3 is not provided within respective pixel regions of the display panel, but is provided directly above the pixel defining layer 9.

The via holes A penetrating through the packing layer 7 and the packaging film 3 may be provided directly above all portions of the pixel defining layer 9, or directly above some portions of the pixel defining layer 9, which is not limited herein.

Specifically, as shown in FIG. 2, the pixel defining layer 9 may be located between the anode 4 and the light emitting layer 5; or the pixel defining layer 9 may be located between the cathode 6 and the light emitting layer 5, which is not limited herein.

Figure 3:
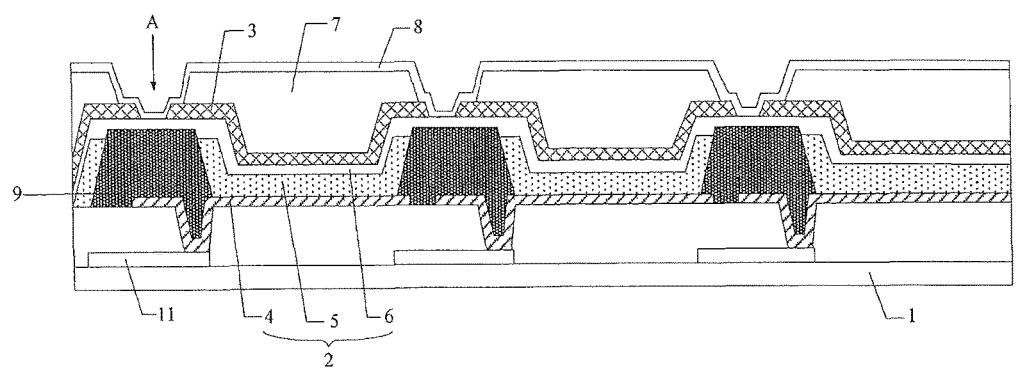

According to one embodiment, when the pixel defining layer 9 is located between the anode 4 and the light emitting layer 5, that is, the light emitting layer 5 is located over the pixel defining layer 9, as shown in FIG. 3, the light emitting layer 5 may be provided with a hollowed-out region at a position corresponding to the via hole A penetrating through the packing layer 7 and the packaging film 3, that is, there is no emitting layer 5 at the position corresponding to the via hole A penetrating through the packing layer 7 and the packaging film 3. With this configuration, oxygen or water from external environment may be prevented from passing through the via hole A penetrating through the packing layer 7 and the packaging film 3 to pollute light emitting layer 5. Specifically, the pattern of the light emitting layer 5 with the hollowed-out region may be formed through a patterning process by using a mask.

In the existing organic electroluminescent display device with the configuration shown in FIG. 1, adhesive is required to assemble the first substrate 101 and the second substrate 102; the larger the size of the display device, the more the adhesive is required to be used, and thus, the larger the area occupied by the adhesive is, thereby reducing the aperture ratio of the display device. Considering this, in the organic electroluminescent display panel according to one embodiment of the present invention, the color filter layer may be directly provided on one side of the base substrate 1 and form the packing layer. Since the packing layer 7 is used as the color filter layer, it is not required to bond a second substrate with the color filter layer thereon like in the prior art, thereby avoiding reduction of the aperture ratio of the display device due to use of the adhesive.

Figure 4:
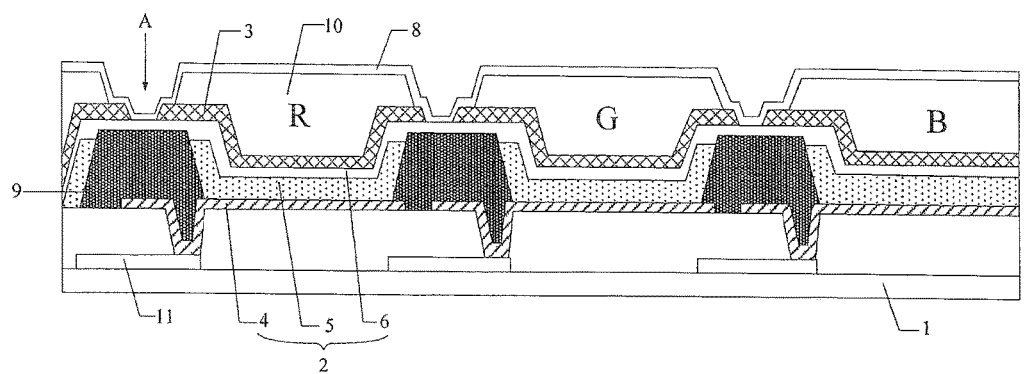

Specifically, as shown in FIG. 4, a color filter layer including filters 10 of at least three different colors is used as the packing layer 7. FIG. 4 illustrates, as an example, the color filter layer comprising filters 10 of three colors including red(R), green(G) and blue (B). Of course, the color filter layer may also comprise filters of four colors including red(R), green(G), blue (B) and yellow(Y); or, the color filter layer may also comprise filters of other color combinations, which is not limited herein.

Of course, the second substrate may be provided above the organic electroluminescent display device shown in FIG. 4, as required.

Figure 5:
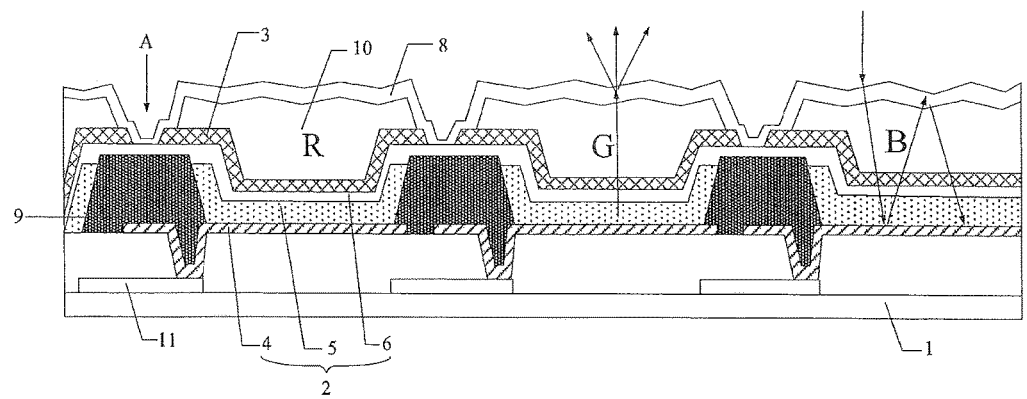

According to one embodiment of the present invention, as shown in FIG. 5, a surface of the color filter layer contacting the secondary electrode 8 may be provided to comprise a convex-concave structure consisting of a plurality of convexes and concaves arranged in an array. Accordingly, the secondary electrode 8 formed on the color filter layer is also provided with a convex-concave structure consisting of a plurality of convexes and concaves arranged in an array. As indicated by the arrows shown in FIG. 5, the color filter layer provided with the plurality of convexes and concaves in an array may not only cause light emitted from the light emitting layer 5 to be scattered on the surface of the color filter layer contacting the secondary electrode 8 so that the light emitting efficiency of the light emitting layer 5 is increased, but also eliminate diffuse reflection of light outside the display panel, thereby display brightness of the display panel can be enhanced.

Figure 6:
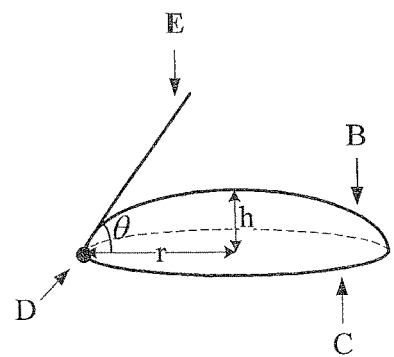
FIG. 6 is a schematic structural diagram showing a spherical segment formed in a color filter layer of an organic electroluminescent display panel according to one embodiment of the present invention.

Specifically, as shown in FIG. 6, the convex-concave structure may consist of a plurality of spherical segments protruding towards the secondary electrode. FIG. 6 only shows one spherical segment. Or, the convex-concave structure may consist of other similar structures, for example, tapered structures or the like, which protrude towards the secondary electrode 8 to cause light emitted from the light emitting layer 5 to be scattered, which is not limited herein.

Preferably, in the organic electroluminescent display panel according to one embodiment of the present invention, shapes of respective spherical segments may be formed to be the same. As shown in FIG. 6, depths of the respective spherical segments are formed to be the same, and radii r of bottom surfaces of the respective the spherical segments are formed to be the same, so that an even display brightness in the entire display panel can be obtained. Here, the depth h of spherical segment is the maximum among vertical distances from points in the spherical surface B of the spherical segment to the bottom surface C thereof. Of course, the shapes of respective spherical segments may be formed differently with each other, which is not limited herein.

Further, as shown in FIG. 6, a ratio of the depth h of the spherical segment to the radius of the bottom surface C of the spherical segment may be set to be within a range of 0.026~0.268:1, that is, an angle between a tangent plane E at a point D of the spherical segment and the bottom surface C of the spherical segment is set to be within in a range of 3°-30°. The point D is a random point on a circle formed by the bottom surface C of the spherical segment intersecting with the spherical surface B. With the above configuration, light emitted from the light emitting layer may be well scattered on the surface of the secondary electrode 8 contacting the color filter layer.

Of course, even if the packing layer 7 is not used as a color filter layer, a surface of the packing layer 7 contacting the secondary electrode 8, may be provided thereon with a convex-concave structure consisting of a plurality of convexes and concaves arranged in an array, as described above, so as to enhance the display brightness of the display panel.

Further, as shown in FIG. 2 to FIG. 5, the organic electroluminescent display panel provided according to embodiments of the present invention may be an active driving organic electroluminescent display panel. That is, the display panel may further comprise thin film transistors 11 configured to drive respective pixel regions of the display panel to display an image, where a drain of the thin film transistor 11 is electrically connected with the anode 4 of the organic electroluminescent structure 2. Or, the organic electroluminescent display panel according to the present inventive concept may also be a passive driving organic electroluminescent display panel. That is, no thin film transistor is provided in the display panel.

Specific embodiment of a method for manufacturing the above organic electroluminescent display panel according to the present invention will be described hereafter in detail.

Figure 7A:
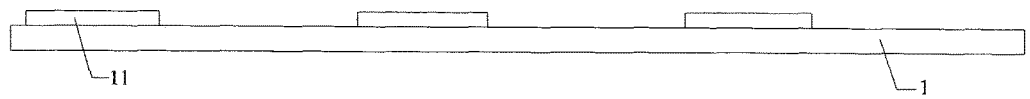
FIG. 7a to FIG. 7j are schematic structural diagrams showing a process of manufacturing the organic electroluminescent display panel shown in FIG. 5.
Figure 7B:
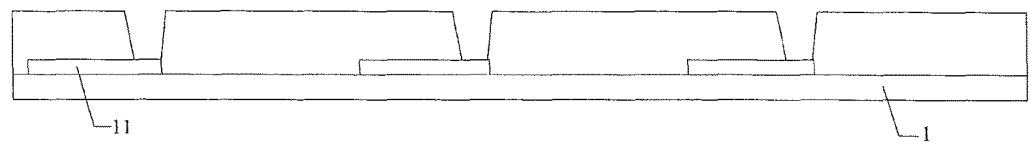
Figure 7C:
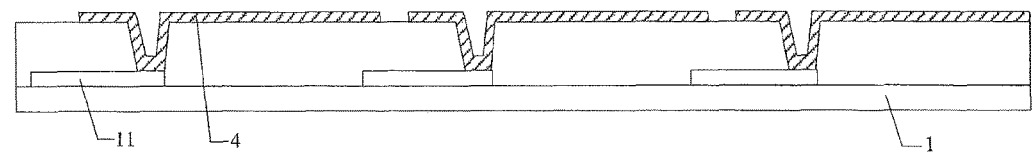
Figure 7D:
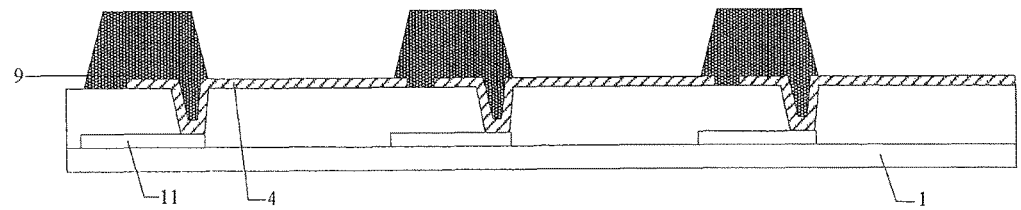
Figure 7E:
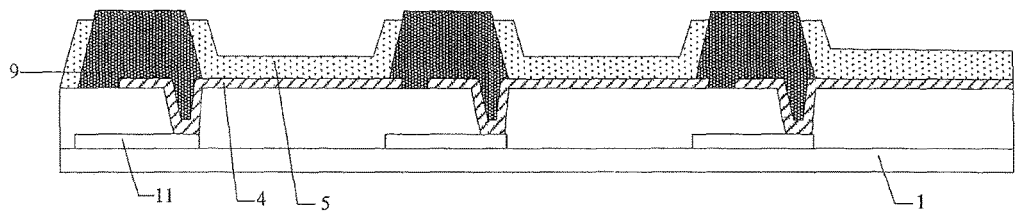
Figure 7F:
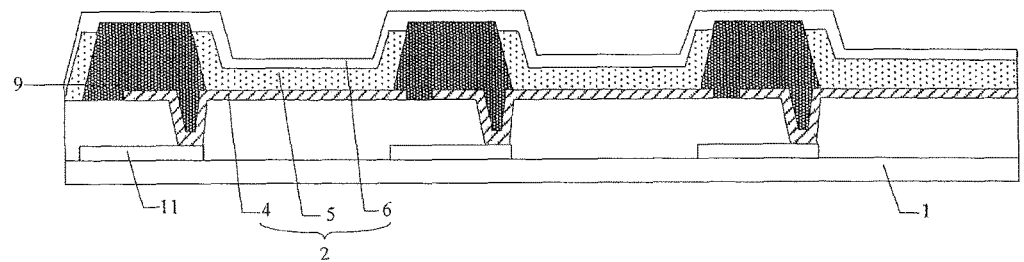
Figure 7G:
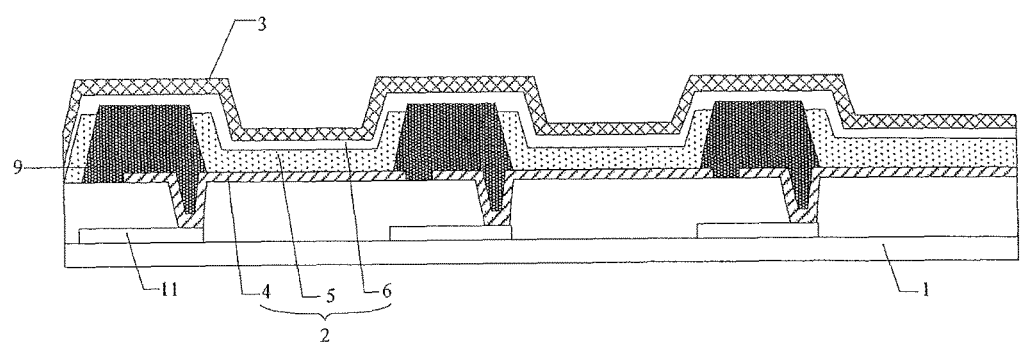
Figure 7H:
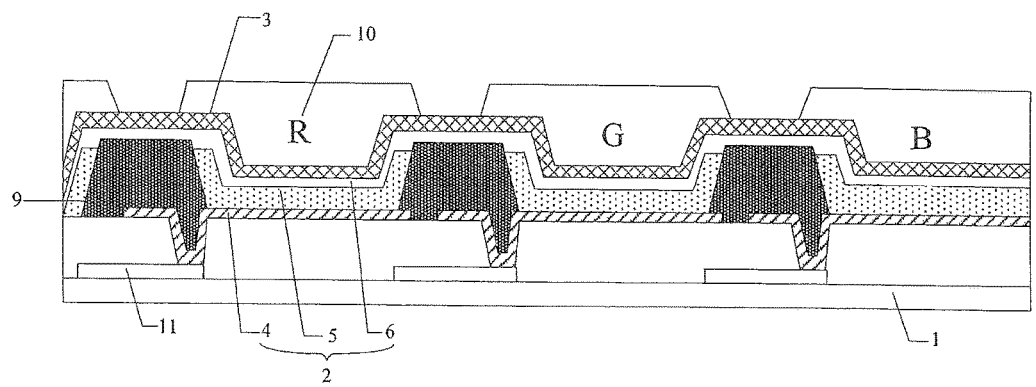
Figure 7I:
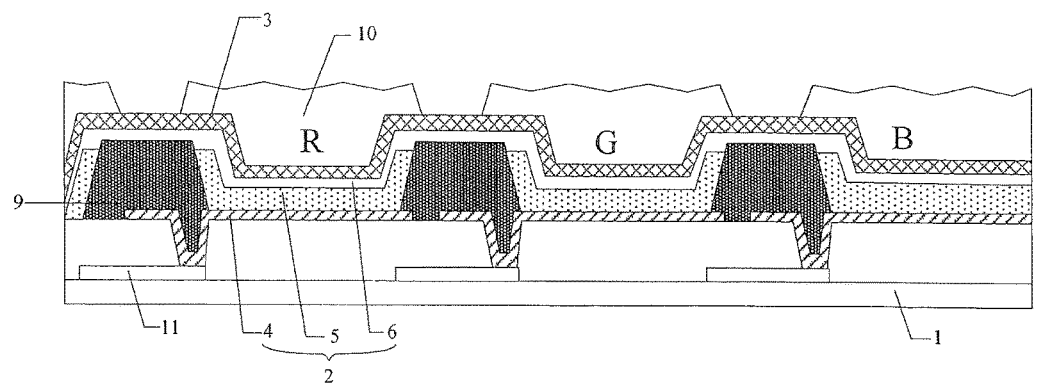
Figure 7J:
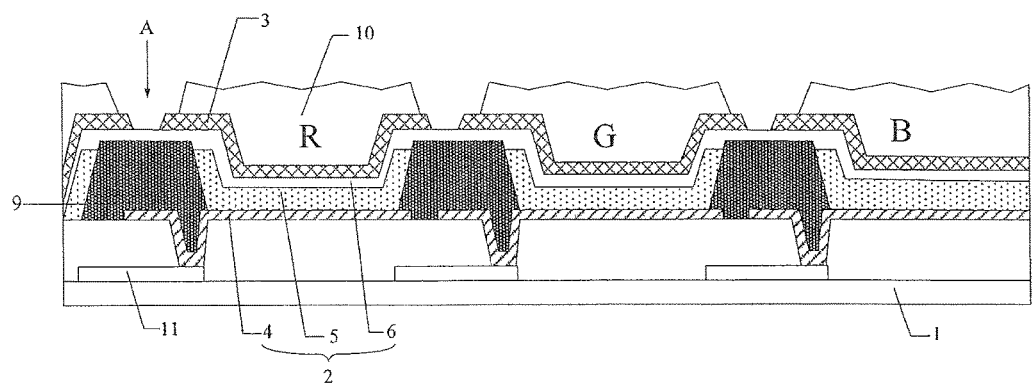

Taking the organic electroluminescent display panel shown in FIG. 5 as example, the method for manufacturing the same may comprises steps of:

1. forming a pattern of the thin film transistor 11 on the base substrate 1, as shown in FIG. 7a;

2. forming an insulating layer on the base substrate 1 formed with the pattern of the thin film transistor 11 thereon, and forming a via hole in the insulating layer above a drain of the thin film transistor 11, as shown in FIG. 7b;

3. forming a pattern of the anode 4 on the insulating layer formed with the via hole therein, as shown in FIG. 7c;

4. forming a pattern of the pixel defining layer 9 on the base substrate 1 formed with the pattern of the anode 4 thereon, as shown in FIG. 7d;

5. forming a pattern of the light emitting layer 5 on the base substrate 1 formed with the pattern of the pixel defining layer 9 thereon, as shown in FIG. 7e;

6. forming the cathode 6 on the base substrate 1 formed with the pattern of the light emitting layer 5 thereon, as shown in FIG. 7f;

7. forming the packaging film 3 on the cathode 6, as shown in FIG. 7g;

8. forming a pattern of the color filter layer on the packaging film 3, as shown in FIG. 7h;

9. performing an embossing process on the pattern of the color filter layer so as to form a convex-concave structure consisting of a plurality of convexes and concaves in an array, as shown in FIG. 7i;

10. etching portions of the packaging film 3 which are not covered by the color filter layer so as to form the via hole A penetrating through the color filter layer and the packaging film 3, as shown in FIG. 7j;

11. forming, by using a magnetron sputtering process, a layer of ITO film, as the secondary electrode 8, on the base substrate 1 with the via hole A penetrating through the color filter layer and the packaging film 3. The secondary electrode 8 is electrically connected with the cathode 6 via the via hole, as shown in FIG. 5.

On basis of the same inventive concept, embodiments of the present invention also provide a display apparatus, comprising the above organic electroluminescent display panel according to the above embodiments. The display apparatus may be any product or part having a display function, such as a mobile phone, a tablet computer, a TV, a display, a laptop, a digital photo frame, a navigator, or the like.

With the organic electroluminescent display panel and display apparatus provided according to embodiments of the present invention, because the secondary electrode is additionally provided on the packaging film and is electrically connected with the cathode through the via hole penetrating through the packaging film, the secondary electrode electrically connected with the cathode can increase an equivalent thickness of the cathode and thus reduce the resistance of the cathode, which can avoid the problem of larger voltage drop due to the larger resistance of the cathode when a thinner metal is used as the cathode, thereby can avoid damage of the organic electroluminescent display panel and thus the display apparatus due to the larger voltage drop.

It is apparent that the person skilled in the art may make various changes and modifications to these embodiments without departing from the principles and spirit of the disclosure, and thus, if these changes and modifications fall within the scope of claims and equivalent thereof of the present invention, the present invention is also intended to include these changes and modifications therein.

What is claimed is:

1. An organic electroluminescent display panel, comprising:
   a base substrate;
   a top-emitting type organic electroluminescent structure disposed on the base substrate, the organic electroluminescent structure comprising an anode, a light emitting layer and a cathode arranged in this order from the base substrate; and
   a packaging film covering the organic electroluminescent structure;
   wherein, the organic electroluminescent display panel further comprises a secondary electrode provided on the packaging film and electrically connected with the cathode through a via hole penetrating through the packaging film;
   wherein the secondary electrode is a substantially continuous layer structure and covers continuously both in the via hole and on the entire packaging film, and
   wherein the organic electroluminescent display panel further comprises a second substrate located above the secondary electrode.

2. The organic electroluminescent display panel according to claim 1, further comprising a packing layer provided on the packaging film, the secondary electrode being provided on the packing layer;
   wherein the secondary electrode is electrically connected with the cathode through a via hole penetrating through the packing layer and the packaging film.

3. The organic electroluminescent display panel according to claim 2, further comprising a pixel defining layer located between the base substrate and the cathode and defining respective pixel regions of the display panel;
   an orthographic projection of the via hole penetrating through the packing layer and the packaging film, which is projected in a direction perpendicular to the base substrate, falls within a region where the pixel defining layer is located.

4. The organic electroluminescent display panel according to claim 3, wherein the pixel defining layer is located between the anode and the light emitting layer, or between the cathode and the light emitting layer.

5. The organic electroluminescent display panel according to claim 4, wherein when the light emitting layer is located over the pixel defining layer, a pattern of the light emitting layer has a hollowed-out region at a position corresponding to the via hole penetrating through the packing layer and the packaging film.

6. The organic electroluminescent display panel according to claim 5, wherein the packing layer is a color filter layer including filters of at least three different colors.

7. The organic electroluminescent display panel according to claim 4, wherein the packing layer is a color filter layer including filters of at least three different colors.

8. The organic electroluminescent display panel according to claim 3, wherein the packing layer is a color filter layer including filters of at least three different colors.

9. The organic electroluminescent display panel according to claim 2, wherein a surface of the packing layer contacting the secondary electrode comprises a convex-concave structure consisting of a plurality of convexes and concaves arranged in an array.

10. The organic electroluminescent display panel according to claim 2, wherein the packing layer is a color filter layer including filters of at least three different colors.

11. The organic electroluminescent display panel according to claim 10, wherein a surface of the color filter layer contacting the secondary electrode comprises a convex-concave structure consisting of a plurality of convexes and concaves arranged in an array.

12. The organic electroluminescent display panel according to claim 11, wherein the convex-concave structure consists of a plurality of spherical segments protruding towards the secondary electrode.

13. The organic electroluminescent display panel according to claim 12, wherein the respective spherical segments have the same depth and bottom surfaces of the respective the spherical segments have the same radius.

14. The organic electroluminescent display panel according to claim 13, wherein a ratio of the depth of the spherical segment to the radius of the bottom surface of the spherical segment is 0.026~0.268: 1.

15. The organic electroluminescent display panel according to claim 2, wherein the cathode is formed through a vapor deposition process.

16. The organic electroluminescent display panel according to claim 2, wherein the secondary electrode is formed through a magnetron sputtering process.

17. The organic electroluminescent display panel according to claim 2, wherein the secondary electrode and the cathode are made of the same material.

18. The organic electroluminescent display panel according to claim 2, wherein the packing layer is made of organic resin material.

19. A display apparatus, wherein comprising the organic electroluminescent display panel according to claim 1.

* * * * *